United States Patent
Shi et al.

(10) Patent No.: US 6,873,547 B1
(45) Date of Patent: Mar. 29, 2005

(54) HIGH CAPACITY MRAM MEMORY ARRAY ARCHITECTURE

(75) Inventors: Xizeng(Stone) Shi, Fremont, CA (US); Hua-Ching Tong, San Jose, CA (US); Aric K. Menon, Lafayette, IN (US)

(73) Assignee: Read Rite Corporation, Fremont, CA (US)

( * ) Notice: Subject to any disclaimer, the term of this patent is extended or adjusted under 35 U.S.C. 154(b) by 35 days.

(21) Appl. No.: 10/080,396

(22) Filed: Feb. 22, 2002

Related U.S. Application Data

(60) Provisional application No. 60/271,207, filed on Feb. 23, 2001.

(51) Int. Cl.[7] .............................................. G11C 11/15
(52) U.S. Cl. ....................... 365/173; 365/158; 365/171
(58) Field of Search ................................ 365/173, 158, 365/171, 200, 201

(56) References Cited

U.S. PATENT DOCUMENTS

| | | | | |
|---|---|---|---|---|
| 5,734,605 A | * | 3/1998 | Zhu et al. | ................... 365/173 |
| 6,055,178 A | * | 4/2000 | Naji | ............................ 365/158 |
| 6,111,781 A | * | 8/2000 | Naji | ............................ 365/158 |
| 6,174,737 B1 | | 1/2001 | Durlam et al. | ................. 438/3 |

OTHER PUBLICATIONS

Jeong, Won–Cheol, et al., "Three level, six state multilevel magnetoresistive RAM (MRAM)," Journal of Applied Physics, Apr. 1999 vol. 85, No. 8, pp. 4782–4784.

* cited by examiner

*Primary Examiner*—Connie C. Yoha
(74) *Attorney, Agent, or Firm*—Joshua C. Harrison, Esq.; Milad G. Shara, Esq.; Sawyer Law Group

(57) ABSTRACT

A magnetic memory is disclosed. The magnetic memory includes a first magnetic tunneling junction and a reference magnetic tunneling junction. The first magnetic tunneling junction includes a first ferromagnetic layer, a second ferromagnetic layer and a first insulating layer between the first ferromagnetic layer and the second ferromagnetic layer. The reference magnetic tunneling junction includes a third ferromagnetic layer, a fourth ferromagnetic layer and a second insulating layer between the third ferromagnetic layer and the fourth ferromagnetic layer. The magnetic memory also includes means for comparing a first output of the first magnetic tunneling junction with a reference output of the reference magnetic tunneling junction.

9 Claims, 3 Drawing Sheets ly, an operational amplifier. The first magnetic tunneling junction 102 is capable of storing data, while the reference magnetic tunneling junction 104 provides a reference.

HIGH CAPACITY MRAM MEMORY ARRAY ARCHITECTURE

CROSS REFERENCE TO RELATED APPLICATION

This application is claiming under 35 USC 19(e) the benefit of provisional patent application Ser. No. 60/271,207, filed Feb. 23, 2001.

FIELD OF THE INVENTION

The present invention relates to magnetic memory systems, particularly magnetic random access memory systems, and more particularly to a method and system for providing a magnetic memory array having a higher capacity.

BACKGROUND OF THE INVENTION

One type of memory currently of interest utilizes magnetic tunneling junctions in the memory cells. A magnetic tunneling junction typically includes two ferromagnetic layers separated by a thin insulating layer. The insulating layer is thin enough to allow charge carriers to tunnel between the ferromagnetic layers. The resistance of the magnetic tunneling junction depends upon the orientation of the magnetizations of the ferromagnetic layers in the magnetic tunneling junction. If the magnetizations of the ferromagnetic layers are parallel, the magnetic tunneling junction is in a low resistance state. If the magnetizations of the ferromagnetic layers are antiparallel, then the magnetic tunneling junction is in a high resistance state.

FIG. 1 depicts a portion of a conventional magnetic random access memory 10. The conventional magnetic memory 10 includes a magnetic tunneling junction 12 and a resistor 14. The magnetic memory 10 also includes an operational amplifier 16, current sources 18 and 20 and voltage source 22. The state of the magnetic tunneling junction 12 is determined by comparing the resistance of the magnetic tunneling junction to that of the static resistor 14. In order to do so, the operational amplifier 16 is used to detect the difference in voltages developed across the magnetic tunneling junction 12 and the resistor 14. If the resistance of the magnetic tunneling junction 12 is greater than the resistance of the resistor 14, then the magnetic tunneling junction 12 is in a high resistance state. If the resistance of the magnetic tunneling junction 12 is less than the resistance of the resistor 14, then the magnetic tunneling junction 14 is in a low resistance state. Thus, the conventional magnetic memory 10 is a two state device.

Although the conventional magnetic memory 10 functions, one of ordinary skill in the art will readily recognize that it is generally desirable to increase the storage capacity of the a memory array.

Accordingly, what is needed is a system and method for providing a magnetic memory cell having an increased capacity. The present invention addresses such a need.

SUMMARY OF THE INVENTION

The present invention a method and system for providing a magnetic memory. The method and system comprise providing a first magnetic tunneling junction and a reference magnetic tunneling junction. The first magnetic tunneling junction includes a first ferromagnetic layer, a second ferromagnetic layer and a first insulating layer between the first ferromagnetic layer and the second ferromagnetic layer. The reference magnetic tunneling junction includes a third ferromagnetic layer, a fourth ferromagnetic layer and a second insulating layer between the third ferromagnetic layer and the fourth ferromagnetic layer. The magnetic memory also includes means for comparing a first output of the first magnetic tunneling junction with a reference output of the reference magnetic tunneling junction.

According to the system and method disclosed herein, the present invention provides a magnetic memory having an increased capacity.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention discloses a method and system for providing a magnetic memory. The method and system comprise providing a first magnetic tunneling junction and a reference magnetic tunneling junction. The first magnetic tunneling junction includes a first ferromagnetic layer, a second ferromagnetic layer and a first insulating layer between the first ferromagnetic layer and the second ferromagnetic layer. The reference magnetic tunneling junction includes a third ferromagnetic layer, a fourth ferromagnetic layer and a second insulating layer between the third ferromagnetic layer and the fourth ferromagnetic layer. The magnetic memory also includes means for comparing a first output of the first magnetic tunneling junction with a reference output of the reference magnetic tunneling junction.

The present invention will be described in terms of particular memory units and certain magnetic memory cells which are preferably part of a larger memory array. However, one of ordinary skill in the art will readily recognize that this method and system will operate effectively for other memory arrays having other or additional components in the magnetic memory cells and/or memory units not inconsistent with the present invention. For example, the present invention will operate effectively for other magnetic tunneling junctions not inconsistent with the present invention.

Figure 1:
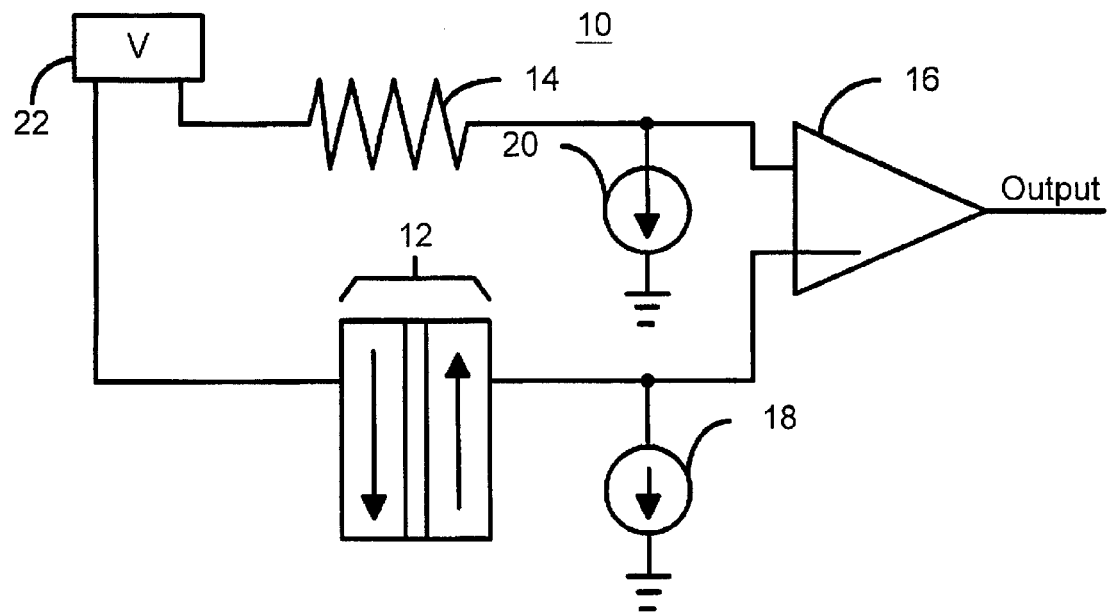
FIG. 1 is a diagram of a portion of a conventional magnetic memory.
Figure 2:
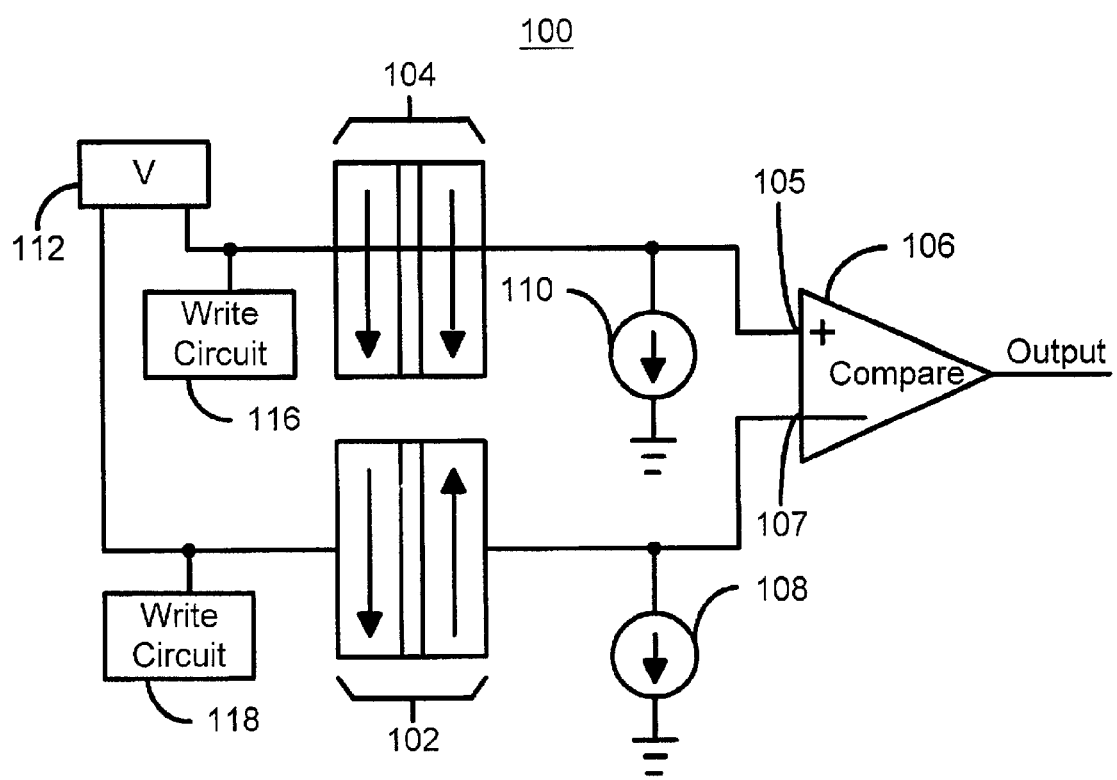
FIG. 2 is a diagram of one embodiment of a magnetic memory cell in accordance with the present invention.

To more particularly illustrate the method and system in accordance with the present invention, refer now to FIG. 2, depicting one embodiment of a magnetic memory cell 100 in accordance with the present invention. The magnetic memory cell 100 is preferably used in a magnetic memory array, such as a magnetic random access memory ("MRAM") chip. The memory cell 100 includes a first magnetic tunneling junction 102 and a second, reference magnetic tunneling junction 104. The memory cell 100 is capable of storing greater than one bit of information. The memory cell 100 includes means 106 for comparing the output of the first magnetic tunneling junction 102 and the reference magnetic tunneling junction 104, which is preferably an operational amplifier 106. In a preferred embodiment, the reference magnetic tunneling junction 104 is coupled to the noninverting input 105 of the operational amplifier 106, while the first magnetic tunneling junction 102 is coupled to the inverting input 107 of the operational amplifier 106. However, other connections could be used in an alternate embodiment. Current sources 108 and 110 provide current to the magnetic tunneling junctions 102 and 104. Also depicted are power supply 112 and write circuit(s) 116 and 118. The reference magnetic tunneling junction 104 is coupled with write circuit 116, while the first magnetic tunneling junction 102 is coupled with the write circuit 118. As a result, the first magnetic tunneling junction 102 can be in either a low resistance state or a high resistance state. Similarly, the reference magnetic tunneling junction 104 can be in either a low resistance state or a high resistance state.

In operation, the magnetic memory cell 100 is written to by writing to one or both of the magnetic tunneling junctions 102 and 104. In particular, the first magnetic tunneling junction 102 can be placed in a high resistance state while the reference magnetic tunneling junction 104 is placed in a low resistance state; the first magnetic tunneling junction 102 can be placed in a low resistance state while the reference magnetic tunneling junction 104 is placed in a high resistance state; or the first magnetic tunneling junction 102 and the reference magnetic tunneling junction 104 can be placed in the same resistance state (both low or both high). Thus, the magnetic memory cell 100 can be placed in one of three states. The magnetic memory cell 100 can be considered to store a "−1" when the first magnetic tunneling junction 102 has a higher resistance (e.g. is in a high resistance state) than the reference magnetic tunneling junction 104 (e.g. which is in a low resistance state). The magnetic memory cell 100 can be considered to store a "1" when the first magnetic tunneling junction 102 has a lower resistance (e.g. in a low resistance state) than the reference magnetic tunneling junction 104 (e.g. which is in a high resistance state). The magnetic memory cell 100 can be considered to store a "0" otherwise. However, another scheme could be used to identify the states of the memory cell 100.

During reading, the resistance of the first magnetic tunneling junction 102 is compared to the resistance of the reference magnetic tunneling junction 104 using the operational amplifier 106. In a preferred embodiment, an equal current is driven through the first magnetic tunneling junction 102 and the reference magnetic tunneling junction 104 by the current source 108 and 110, respectively. The voltage drop across the magnetic tunneling junctions 102 and 104 by the operational amplifier 106, which outputs "1", "0" or "−1" depending upon the states of the magnetic tunneling junctions 102 and 104, as described above. Thus, the magnetic memory cell 100 is a three state device. The magnetic memory cell 100 is, therefore, capable of storing greater than one bit even though the magnetic memory cell 100 uses only one magnetic tunneling junction with one reference magnetic tunneling junction.

Figure 3:
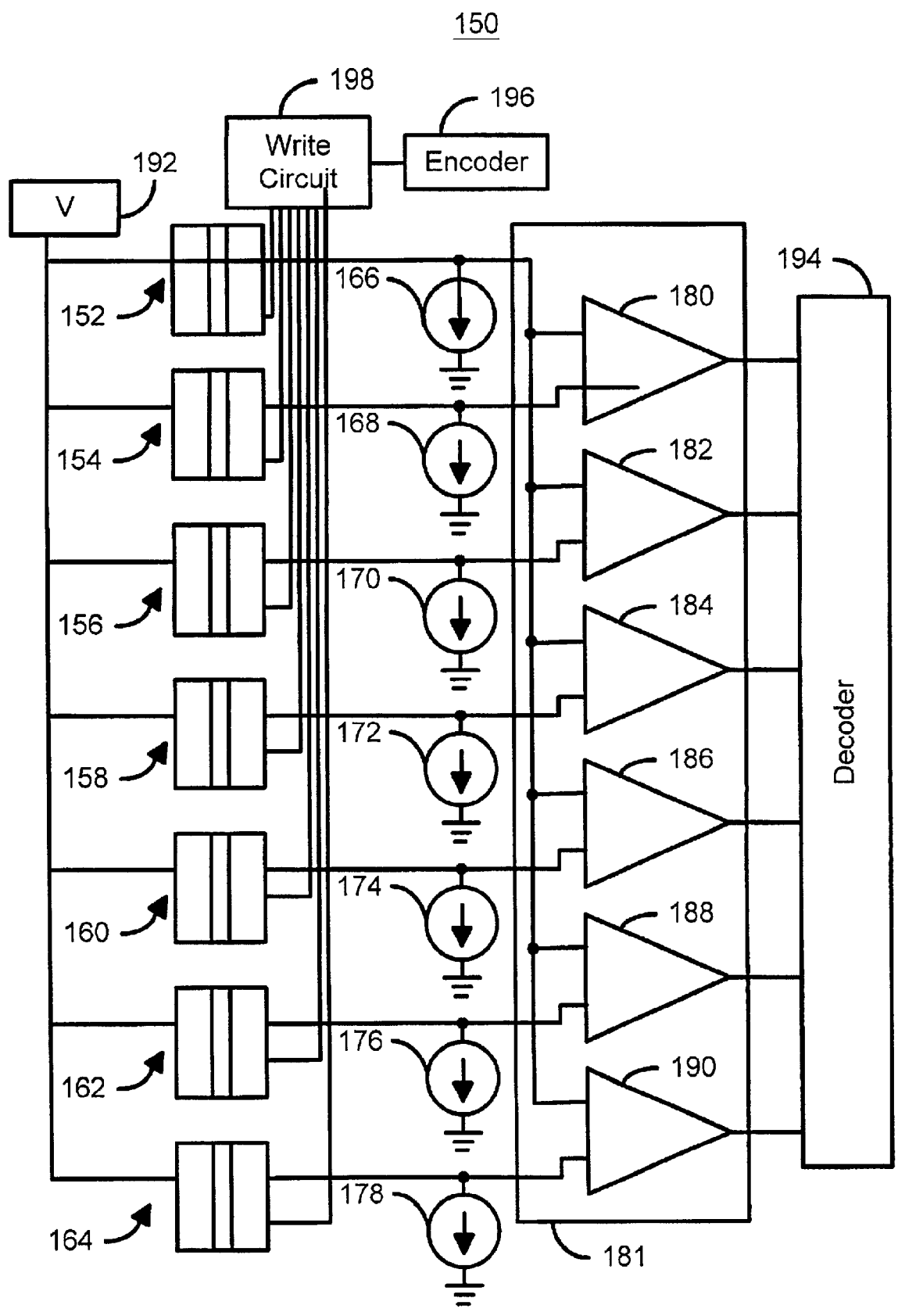
FIG. 3 is a diagram of one embodiment of a memory unit in accordance with the present invention.

FIG. 3 is a diagram of one embodiment of a memory unit 150 in accordance with the present invention. The memory unit 150 is part of a memory, which is preferably an MRAM. The memory unit 150 is an eight-bit memory unit, but uses only seven magnetic tunneling junctions 152, 154, 156, 158, 160, 162 and 164. The magnetic tunneling junctions 152, 154, 156, 158, 160, 162 and 164 are preferably the same as the magnetic tunneling junctions 102 and 104. The magnetic tunneling junctions 152, 154, 156, 158, 160, 162 and 164 are coupled with current sources 166, 168, 170, 172, 174, 176 and 178, respectively. The magnetic tunneling junctions 152, 154, 156, 158, 160, 162 and 164 are also coupled with a power supply 192. The magnetic tunneling junction 152 is a reference magnetic tunneling junction 152. The remaining magnetic tunneling junctions 153, 156, 158, 160, 162 and 164 are used to store data. The reference magnetic tunneling junction 152 and the magnetic tunneling junctions 152, 154, 156, 158, 160, 162 and 164 are coupled with a comparison block 181. The comparison block 181 preferably includes operational amplifiers 180, 182, 184, 186, 188 and 190. In particular, the reference magnetic tunneling junction 152 is coupled with each of the operational amplifiers 180, 182, 184, 186, 188 and 190. In operation, the reference magnetic tunneling junction 152 as well as the magnetic tunneling junctions 154, 156, 158, 160, 162 and 164 can be programmed to be in either a low resistance state or a high resistance state. Thus, each of the magnetic tunneling junctions 154, 156, 158, 160, 162 and 164 can have a resistance that is higher than the resistance of the reference magnetic tunneling junction 152, lower than the resistance of the reference magnetic tunneling junction 152 or neither. Thus, the combination of the six magnetic tunneling junctions 154, 156, 158, 160, 162 and 164 and the reference magnetic tunneling junction 152 can store eight bits.

The output of the six operational amplifiers 180, 182, 184, 186, 188 and 190 can be considered to be a six-bit three state output. Thus, the six-bit three state memory can store up to $3^6$, or 729 bits. In contrast, an eight-bit two state memory can store up to $2^8$, or 256 bits. In a preferred embodiment, the output of the six operational amplifiers 180, 182, 184, 186, 188 and 190 is converted to allow the output to be read. Consequently, in a preferred embodiment, a decoder 194 is provided. The decoder 194 converts the six-bit three state data to eight-bit two state data. In one embodiment, the decoder 194 could also be used with other memory units (not shown). For similar reasons, an encoder 196 can be used in conjunction with the write circuit(s) 198 for the memory unit 150. In one embodiment, the encoder 196 could be used for other memory units (not shown).

Thus, the memory unit 150 can be used as an eight bit memory unit. The memory unit 150 uses only six magnetic tunneling junctions 154, 156, 158, 160, 162 and 164 and one reference magnetic tunneling junction 152, while a conventional memory unit storing the same amount of data would require eight magnetic tunneling junctions. Consequently, the memory unit 150 represents a 14.2% increase in capacity. Thus, the memory unit 150 has greater capacity.

Figure 4:
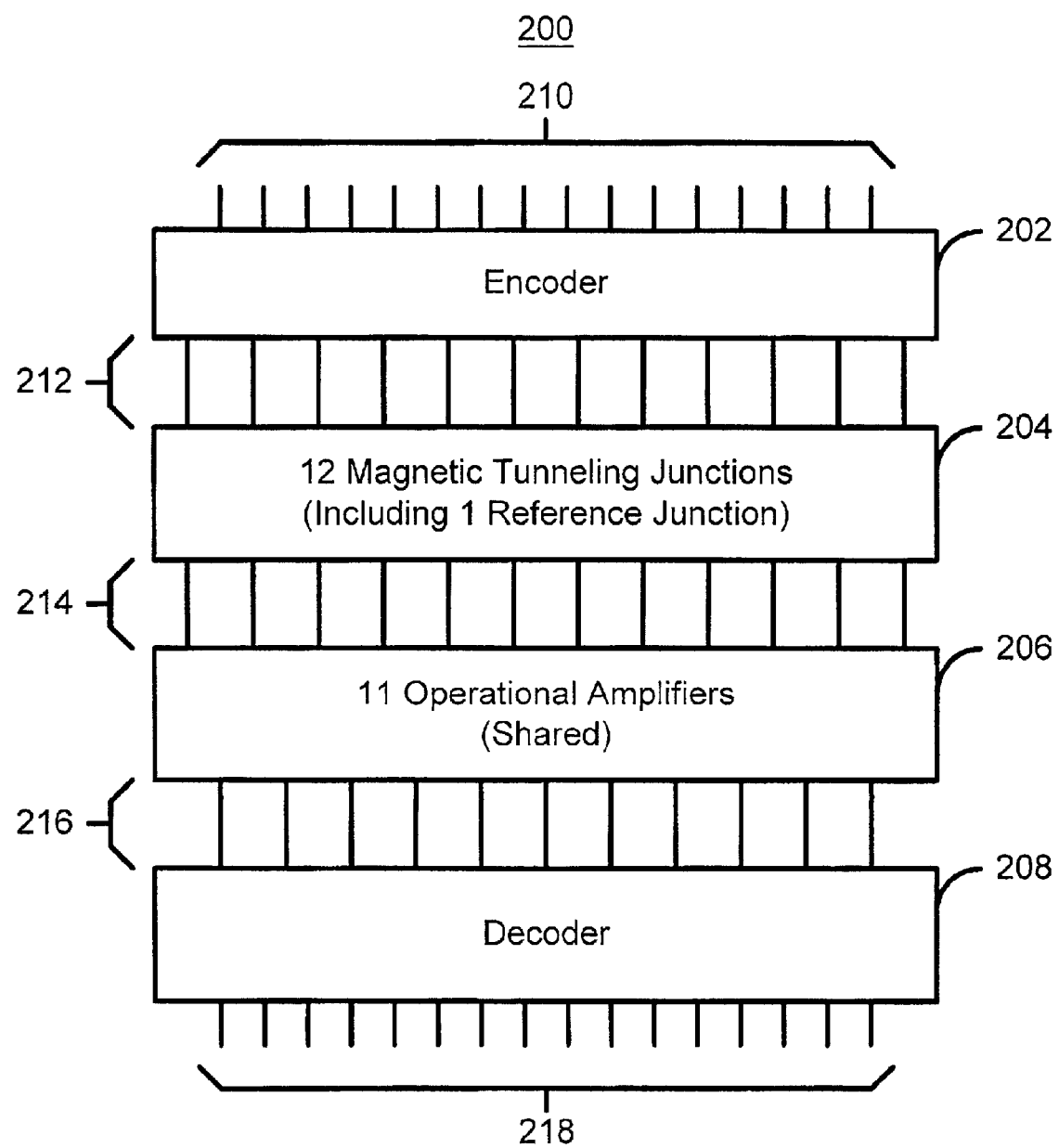
FIG. 4 is a diagram of a second embodiment of a memory unit in accordance with the present invention.

FIG. 4 is a diagram of a second embodiment of a memory unit 200 in accordance with the present invention. The memory unit 200 includes an encoder 202 for converting and writing data to the three state memory unit cells. The memory unit 200 includes a block 204 of twelve magnetic tunneling junctions. The twelve magnetic tunneling junctions include one reference magnetic tunneling junctions and eleven magnetic tunneling junctions used to store data. The memory unit also includes comparison block 206 and decoder 208. The comparison block 206 preferably includes eleven operational amplifiers. The decoder 208 converts the three state data to two state data. The decoder is coupled to sixteen bit output 218. The memory unit 200 thus utilizes a total of twelve magnetic tunneling junctions in the block 204 (eleven magnetic tunneling junctions plus one reference magnetic tunneling junction) in order to store sixteen bits of data. A conventional magnetic memory array would utilize sixteen magnetic tunneling junctions in order to store sixteen bits of data. Thus, the memory unit 200 has a capacity increase of about thirty three percent over a conventional sixteen bit magnetic memory array.

The memory units 100, 150 and 200 can store a greater amount of data because a programmable reference magnetic tunneling junction is used in lieu of a static resistor to provide a reference signal. As a result, the memory units 100, 150 and 200 have increased capacity.

A method and system has been disclosed for a magnetic memory cell, a magnetic memory unit and a method for utilizing the memory cell and unit with increased capacity. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic memory unit comprising:
   a plurality of magnetic tunneling junctions for storing data, each of the plurality of magnetic tunneling junctions including a first ferromagnetic layer, a second ferromagnetic layer and a first insulating layer between the first ferromagnetic layer and the second ferromagnetic layer;
   a reference magnetic tunneling junction including a third ferromagnetic layer, a fourth ferromagnetic layer and a second insulating layer between the third ferromagnetic layer and the fourth ferromagnetic layer; and
   means, coupled with the plurality of magnetic tunneling junctions and the reference magnetic tunneling junction, for comparing a plurality of outputs of the plurality of magnetic tunneling junctions with a reference output of the reference magnetic tunneling junctions;
   wherein the plurality of magnetic tunneling junctions includes six magnetic tunneling junctions and wherein the magnetic memory is capable of storing eight bits.

2. The magnetic memory unit of claim 1 wherein the comparing means further includes a plurality of operational amplifiers, each of the plurality of operational amplifiers having a first input and a second input, the first input being coupled with a magnetic tunneling junction of the plurality of magnetic tunneling junctions, the second input being coupled with the reference magnetic tunneling junction.

3. The magnetic memory unit of claim 1 further comprising:
   a plurality of current sources, a current source of the plurality of current source coupled with a corresponding magnetic tunneling junction of the plurality of magnetic tunneling junctions, and with the reference magnetic tunneling junction.

4. The magnetic memory unit of claim 1 further comprising:
   a plurality of write circuits coupled with the plurality of magnetic tunneling junctions and with the reference magnetic tunneling junction.

5. A magnetic memory unit comprising:
   a plurality of magnetic tunneling junctions for storing data, each of the plurality of magnetic tunneling junctions including a first ferromagnetic layer, a second ferromagnetic layer and a first insulating layer between the first ferromagnetic layer and the second ferromagnetic layer;
   a reference magnetic tunneling junction including a third ferromagnetic layer, a fourth ferromagnetic layer and a second insulating layer between the third ferromagnetic layer and the fourth ferromagnetic layer; and
   means, coupled with the plurality of magnetic tunneling junctions and the reference magnetic tunneling junction, for comparing a plurality of outputs of the plurality of magnetic tunneling functions with a reference output of the reference magnetic tunneling junction;
   wherein the plurality of magnetic tunneling junctions includes eleven magnetic tunneling junctions and wherein the magnetic memory unit is capable of storing sixteen bits.

6. The magnetic memory unit of claim 1 wherein the magnetic memory unit is part of a magnetic random access memory.

7. A method for using a magnetic memory cell comprising the steps of:
   (a) programming a first magnetic tunneling junction, the first magnetic tunneling junction including a first ferromagnetic layer, a second ferromagnetic layer and a first insulating layer between the first ferromagnetic layer and the second ferromagnetic layer;
   (b) programming a reference magnetic tunneling junction including a third, ferromagnetic layer, a fourth ferromagnetic layer and a second insulating layer between the third ferromagnetic layer and the fourth ferromagnetic layer; and
   (c) comparing a first output of the first magnetic tunneling junctions with a reference output of the reference magnetic tunneling junction.

8. A method for using a magnetic memory cell comprising the steps of:
   (a) programming a plurality of magnetic tunneling junctions, the plurality of magnetic tunneling junctions further including a first number of magnetic tunneling junctions;
   (b) programming a reference magnetic tunneling junction including a third ferromagnetic layer, a fourth ferromagnetic layer and a second insulating layer between the third ferromagnetic layer and the fourth ferromagnetic layer; and
   (c) comparing a first output of each of the plurality of magnetic tunneling junctions with a reference output of the reference magnetic tunneling junction such that the plurality of magnetic tunneling junctions are capable of storing a number of bits greater than the first number plus one.

9. A magnetic memory unit comprising:
   a plurality of magnetic tunneling junctions for storing data, the plurality of magnetic tunneling junctions having a first number of magnetic tunneling junctions;
   a reference magnetic tunneling junction; and
   means, coupled with the plurality of magnetic tunneling junctions and the reference magnetic tunneling junction, for comparing a plurality of output of each of the plurality of magnetic tunneling junctions with a reference output of the reference magnetic tunneling junction;
   wherein the plurality of magnetic tunneling junctions is capable of storing a number of bits, the number of bits being greater than the first number plus one.

* * * * *